(12) United States Patent
Ohta (10) Patent No.: US 6,529,425 B2
(45) Date of Patent: Mar. 4, 2003

(54) WRITE PROHIBITING CONTROL CIRCUIT FOR A SEMICONDUCTOR DEVICE

(75) Inventor: Hiroo Ohta, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/991,239

(22) Filed: Nov. 9, 2001

(65) Prior Publication Data

US 2002/0057603 A1 May 16, 2002

(30) Foreign Application Priority Data

Nov. 13, 2000 (JP) ........................................ 2000-344823

(51) Int. Cl.[7] ................................................. G11C 7/00
(52) U.S. Cl. ................... 365/195; 365/190; 365/230.09
(58) Field of Search ................................ 365/195, 196, 365/191, 189.04, 230.09, 189.08, 233, 190

(56) References Cited

U.S. PATENT DOCUMENTS

| 4,669,064 A | * | 5/1987 | Ishimoto | 365/189.05 |
|---|---|---|---|---|
| 4,947,374 A | * | 8/1990 | Wada et al. | 365/195 |
| 5,148,396 A | | 9/1992 | Nakada | 365/189.03 |
| 5,777,938 A | * | 7/1998 | Nakamura et al. | 365/189.05 |
| 5,808,961 A | * | 9/1998 | Sawada | 365/194 |
| 5,867,446 A | * | 2/1999 | Konishi et al. | 365/189.05 |
| 5,991,197 A | * | 11/1999 | Ogura et al. | 365/185.04 |

FOREIGN PATENT DOCUMENTS

| JP | 10199248 | * | 7/1998 |
|---|---|---|---|

* cited by examiner

*Primary Examiner*—Richard Elms
*Assistant Examiner*—Hien Nguyen
(74) *Attorney, Agent, or Firm*—Hogan & Hartson, LLP (57) ABSTRACT

In a multiple bits product, when respective bit is in a specific data direction, a selecting signal for making a corresponding column selecting switch ON is made ineffective. Thereby, in the multiple bits product, whether writing is executed in an arbitrary data direction can be selected for respective bit.

16 Claims, 6 Drawing Sheets

Fig. 1

(Conventional technology)

| | | | | |
|---|---|---|---|---|
| Data already stored to the memory cell | 0 | 0 | 1 | 1 |
| Input data Din | 0 | 1 | 0 | 1 |
| A result of the memory cell | 0 | 1 | 0 | 1 |

(First embodiment of the invention)

| | | | | |
|---|---|---|---|---|
| Data already stored to the memory cell | 0 | 0 | 1 | 1 |
| Input data Din | 0 | 1 | 0 | 1 |
| A result of the memory cell | 0 | 0 | 0 | 1 |

Fig. 2

1) Timing (Asynchronized type)

"0" data is written
"1" data is prohibited from being written

Fig. 3A

2) Timing (Synchronized type)

"0" data is written
"1" data is prohibided from being written

WRITE PROHIBITING CONTROL CIRCUIT FOR A SEMICONDUCTOR DEVICE

CROSS-REFERENCE TO RELATED APPLICATIONS

This application is based upon and claims the benefit of priority from the prior Japanese Patent Application No. 2000-344823, filed Nov. 13, 2000, the entire contents of which are incorporated herein by reference.

BACKGROUND OF THE INVENTION

1. Field of the Invention

The present invention relates to a semiconductor memory device inputted with multiple bits of input data.

2. Description of the Related Art

Conventionally, there has been provided a semiconductor memory device inputted with multiple bits of input data.

Even in such a multiple bits product, in an application field of Fail memory (memory for storing fail address detected in a memory tester) or an applied product for image processing, there has been request of intending to execute rewriting operation of data for respective bits of input data of multiple bits.

Meanwhile, there is provided a multiple bits product having a function for prohibiting a total of data inputted by being controlled by data writing signals or the like, from writing the data.

However, in order to rewrite portions of bits of input data of multiple bits, there is needed operation of temporarily reading a total of data stored to memory cells of corresponding addresses, inputting the total of data to registers, rewriting data of bits intended to rewrite and writing the total of data again.

Although there is provided the conventional multiple bits products having the function of prohibiting a total of input data from being written in this way, it cannot be selected whether data is written with regard to an arbitrary data direction ("0" data or "1" data) at respective bits.

The invention has been carried out in view of the above-described problem and it is an object thereof to be capable of selecting whether data is written in an arbitrary data direction for respective bits in a multiple bits products.

BRIEF SUMMARY OF THE INVENTION

A semiconductor memory device according to a first aspect of the present invention comprises a plurality of memory cells for storing data, a plurality of input data control circuits for receiving input data of multiple bits, and a plurality of write control circuits for prohibiting data from being written to corresponding ones of the memory cells at respective bits of the input data when the respective bits of the input data is predetermined data.

A semiconductor memory device according to a second aspect of the present invention comprises plurality of memory cells for storing data, a plurality of bit line pairs connected to the memory cells, a plurality of input data control circuits for receiving input data of multiple bits, a plurality of selecting circuits each for selecting the bit line pairs, the selecting circuits are provided in correspondence with the bit line pairs, and a plurality of selection control circuits for controlling selection/non-selection of the selecting circuits, each of the selection control circuits is provided in correspondence with each of the selecting circuits, wherein each of the selection control circuits determines corresponding one of the selecting circuits as non-selection when a corresponding bit of the input data is predetermined data.

DETAILED DESCRIPTION OF THE INVENTION

<<THE FIRST EMBODIMENT>>

Figure 1:
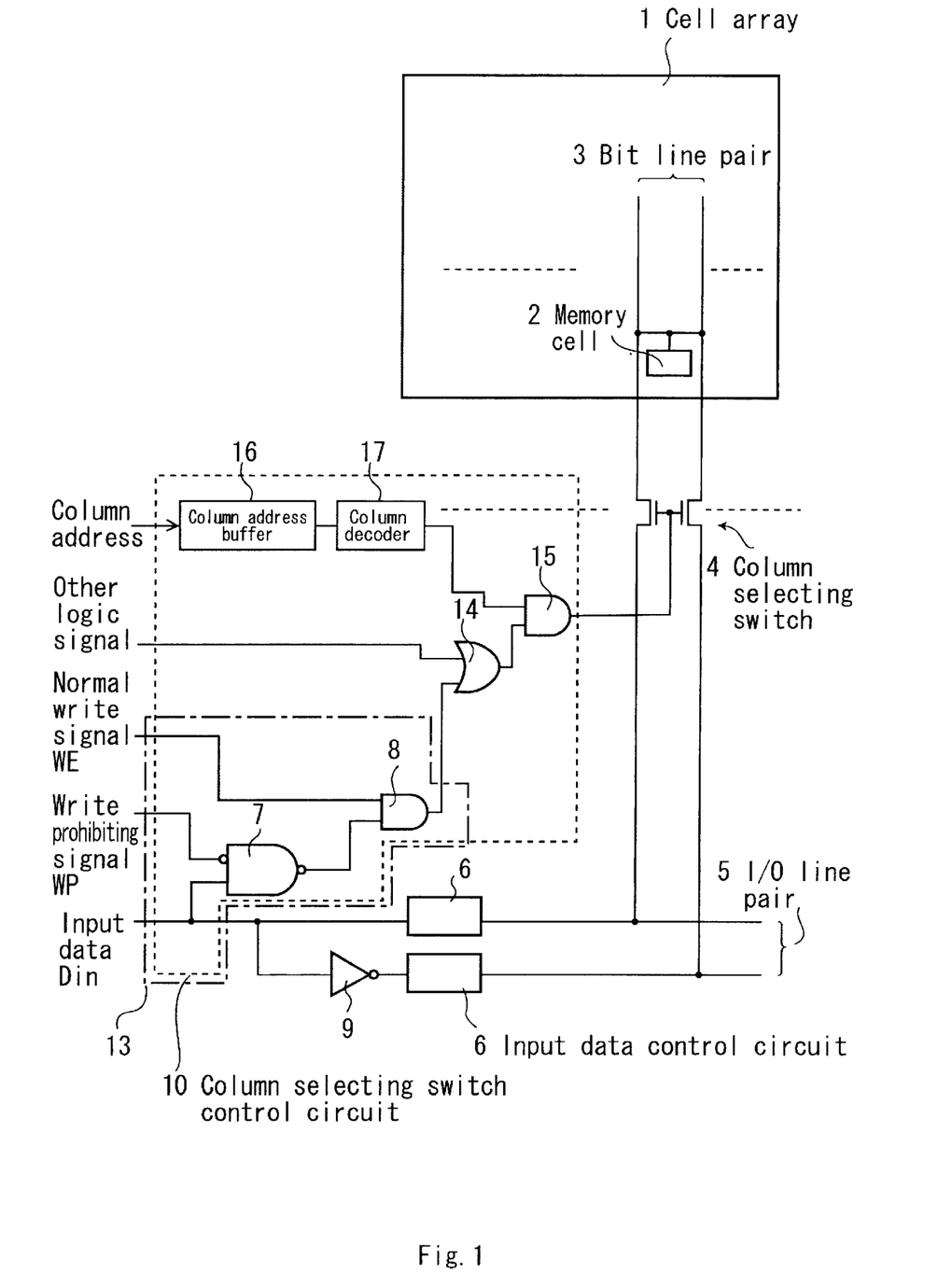
FIG. 1 is a circuit constitution diagram of a semiconductor memory device according to a first embodiment of the invention.

FIG. 1 shows a circuit constitution diagram of a semiconductor memory device according to a first embodiment of the invention. According to the embodiment, there is shown an example of a case of prohibiting "1" data from being written.

As shown by FIG. 1, a cell array 1 includes a plurality of memory cells 2 for storing data of "0" or "1" and a bit line pair 3 connected thereto. Although in this case, there is illustrated a diagram of applying a cell of SRAM as the memory cell 2, as the memory cell, not only SRAM but also a cell of other semiconductor memory device such as DRAM or the like can also be used.

The respective bit line pair 3 is connected to an I/O line pair 5 via column selecting switch 4. A column selecting switch control circuit 10 is connected to the gate of a transistor constituting the column selecting switch 4. The column selecting switch control circuit 10 is inputted with column addresses, normal write signal WE, write prohibiting signal WP and input data Din as well as a logic signal from a control terminal.

Specifically, the column selecting switch control circuit 10 is provided with an NAND circuit 7 inputted with the input data Din and the write prohibiting signal WP, an AND circuit 8 inputted with an output of the NAND circuit 7 and the normal write signal WE, an OR circuit 14 inputted with an output of the AND circuit 8 and the logic signal from the control terminal and an AND circuit 15 inputted with an output of the OR circuit 14 and an output of a column decoder 17. Further, the column addresses are inputted to the column decoder 17 via a column address buffer 16.

Meanwhile, the input data Din becomes a complementary signal and inputted to an input data control circuit 6. The input data control circuit 6 is connected to the I/O line pair 5. The I/O line pair 5 is connected to the bit line pair 3 via the column selecting switch 4.

Writing operation of the semiconductor memory device is executed as follows.

First, the input data Din inputted from outside constitutes the complementary signal by data transmitted to the input control circuit 6 as it is and data transmitted to the input data control circuit 6 via an inverter 9. Here, the input data control circuit 6 controls to prohibit the input data Din from being transmitted to the I/O line pair 5 in reading and controls timings of writing the input data Din.

Further, the input data Din outputted from the input data control circuit 6 passes through the I/O line pair 5, is transmitted to the bit line pair 3 via the column selecting switch 4 and is stored to the memory cell 2. The column selecting switch 4 is a selecting circuit for selecting the column of the memory cell to which the input data Din is written.

Here, the first embodiment of the invention is characterized in constituting the column selecting switch control circuit 10 for controlling the column selecting switch 4 as follows.

That is, conventionally, the column selecting switch 4 is controlled by signals mainly from the column decoder 17. In contrast thereto, the embodiment is characterized in that the column selecting switch control circuit includes a write prohibiting control circuit 13.

Specifically, the write prohibiting control circuit 13 is provided with the NAND circuit 7 inputted with the input data Din and the write prohibiting signal WP and the AND circuit 8 inputted with the output of the NAND circuit 7 and the normal write signal WE. The output of the AND circuit 8 and a logic signal (for example, signal for reading) from other control terminal, not illustrated, are inputted to the OR circuit 14 and the output of the OR circuit 14 and an output from the column decoder 17 are inputted to the AND circuit 15. The output from the AND circuit 15 is inputted to the gate of the column selecting switch 4.

Further, although the write prohibiting signal WP is constituted by negative logic in FIG. 1, when the signal WP is constituted by positive logic, before establishing logic with the input data Din in the NAND circuit 7, the signal WP may be converted into an inverse signal.

Next, an explanation will be given of operation of the column selecting switch control circuit 10.

When in a write state, a certain column address is selected, further, it is intended to prohibit to write predetermined data to a memory cell in correspondence with the column address (here, "1" data is prohibited from being written), Low level (hereinafter, referred to as "L level") is inputted as the write prohibiting signal WP.

In this case, when "1" is inputted as the input data Din, the output of the NAND circuit 7 becomes L level. Therefore, the output of the AND circuit 8 becomes L level. Thereby, the column selecting switch 4 is made OFF and the input data "1" is not written to the memory cell 2.

Meanwhile, when "0" is inputted as the input data Din, the output of the NAND circuit 7 becomes High level (hereinafter, referred to as "H level") and when the normal write signal WE is at H level, the output of the AND circuit 8 also becomes H level. Thereby, when the signal from the column decoder 17 is also at H level, the column selecting switch 4 becomes ON and the input data "0" is written to the memory cell 2.

Further, when the normal write signal WE is at L level, regardless of the write prohibiting signal WP or the input data Din, the output of the AND circuit 8 becomes L level. Thereby, the column selecting switch 4 is made OFF and the input data is not written to the memory cell 2.

Figure 2:
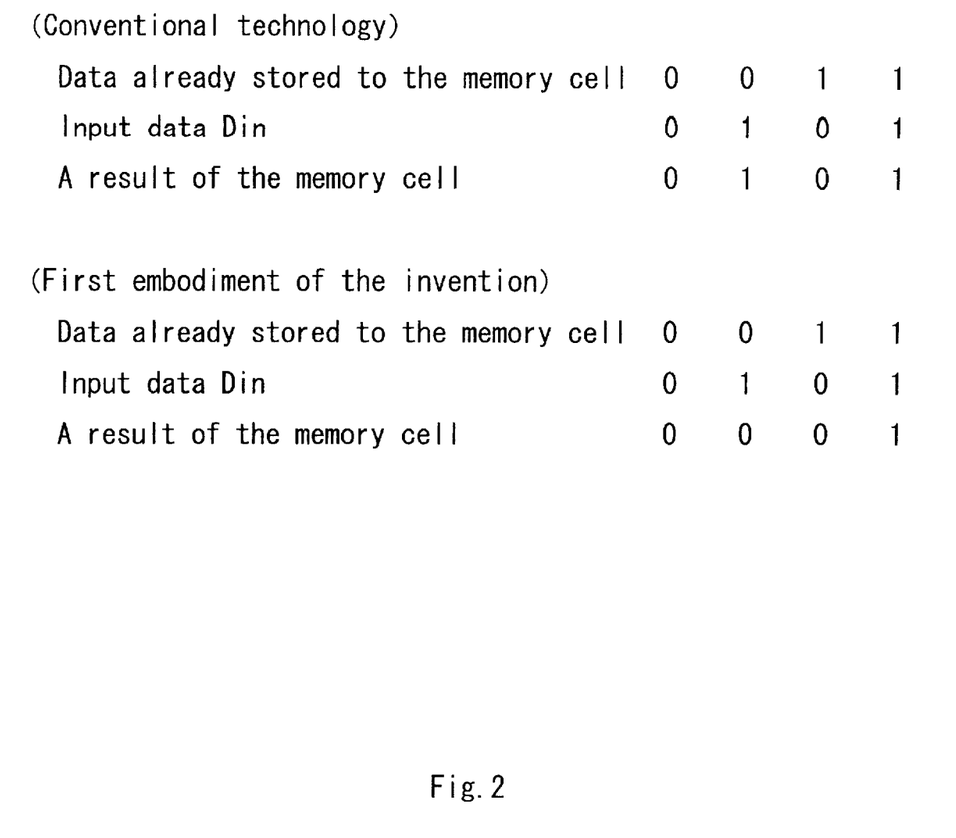
FIG. 2 illustrates diagrams showing a result of operation of the semiconductor memory device according to the first embodiment of the invention.

FIG. 2 shows what result is stored to the memory cell by operating the column selecting switch control circuit 10 as described above.

As is known from FIG. 2, according to the conventional technology, data stored as a result of the memory cell necessarily coincides with the input data Din. In contrast thereto, according to the first embodiment of the invention, when the input data Din is "1", existing data already stored to the memory cell is stored as it is as the result.

Figure 3A:
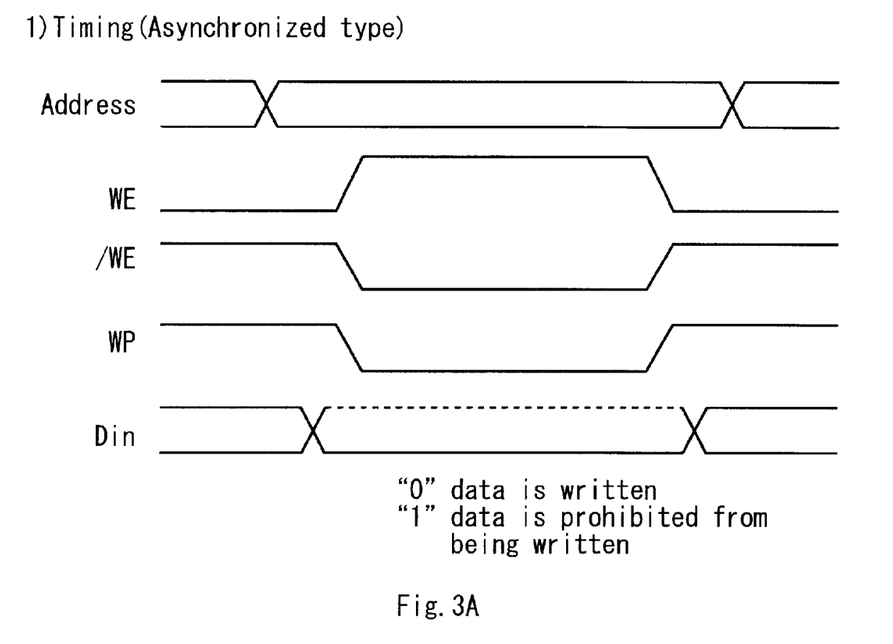
FIG. 3A illustrates an operational timing chart for an a synchronized clock type semiconductor device and FIG. 3B illustrates a timing chart for a synchronized clock type semiconductor device according to embodiments of the present invention.
Figure 3B:
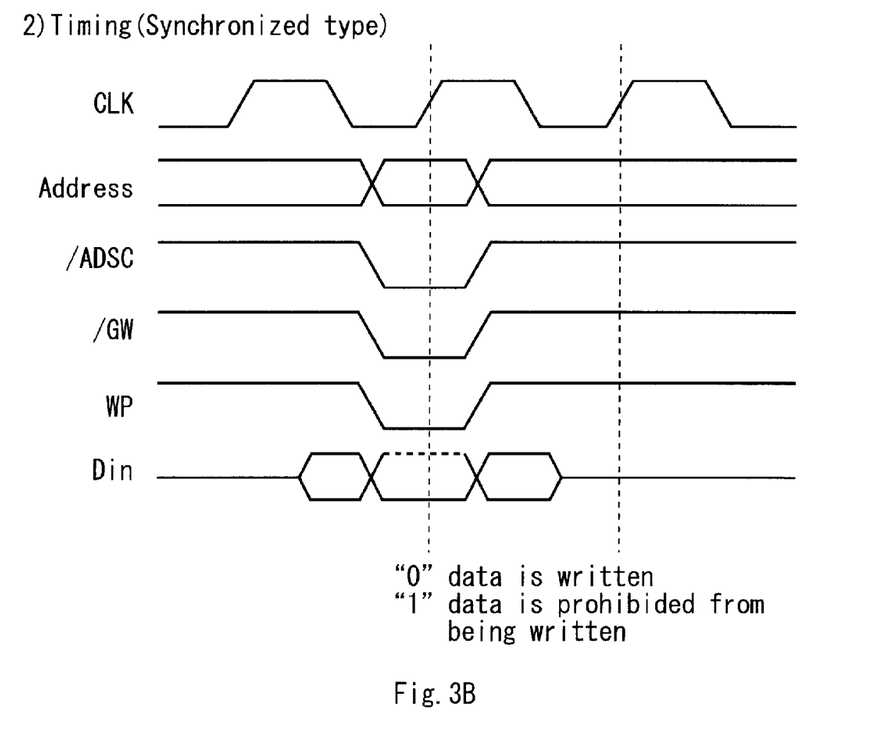

Next, FIGS. 3(A) and 3(B) show operational timing charts of the embodiment. FIG. 3(A) shows a case of a clock a synchronized type and FIG. 3(B) shows a case of a clock synchronized type.

As shown by FIG. 3(A), according to a semiconductor memory device of the clock a synchronized type, when an address signal Address is determined, the write signal WE (/inverted signal of WE) becomes H level and the write prohibiting signal WP becomes L level, in the case in which the input data Din is "0", data is written to the memory cell 2, in the case in which the input data Din is "1", data is prohibited from being written to the memory cell 2.

As shown by FIG. 3(B), according to a semiconductor memory device of the clock synchronized type, when the address signal Address, an address status control signal/ADSC (signal for inputting address information to inside of device), a global write signal/GW (signal determining write operation or read operation) and the write prohibiting signal WP are determined in synchronism with a clock signal CLK. Also in this case, when the write prohibiting signal WP becomes L level, in the case in which the input data Din is "0", data is written to the memory cell 2, in the case in which the input data Din is "1", data is prohibited from being written to the memory cell 2.

As mentioned above, according to the first embodiment of the invention, in the multiple bits product, there is enabled selection of whether the input data is written in an arbitrary data direction ("1" in first embodiment) for respective bits.

<<THE SECOND EMBODIMENT>>

Figure 4:
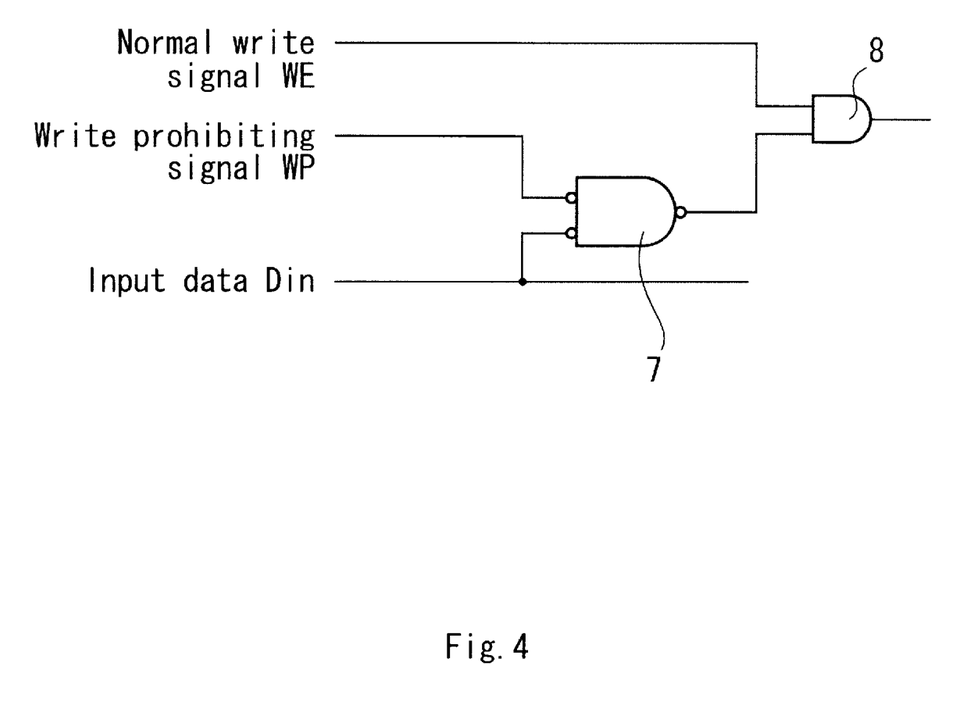
FIG. 4 is a column selecting switch control circuit diagram according to a second embodiment of the invention.

FIG. 4 shows a circuit constitution diagram of a semiconductor memory device according to a second embodiment of the invention. However, FIG. 4 illustrates only the write prohibiting control circuit 13 constituting the column selecting switch control circuit 10. The other portion is provided with a constitution the same as that of FIG. 1. According to the embodiment, there is shown an example of a case of prohibiting "0" data from being written.

The write prohibiting control circuit 13 shown in FIG. 4, differs from the write prohibiting control circuit shown in FIG. 1 in that the input data Din is inverted and inputted to the NAND circuit 7.

When such a circuit is constituted, in the case in which the write prohibiting signal WP becomes L level, when "0" is inputted as the input data Din, the output of the NAND circuit 7 becomes L level. Therefore, the output of the AND circuit 8 becomes L level. Thereby, the column selecting switch 4 is made OFF and the input data "0" is not written to the memory cell 2.

Meanwhile, when "1" is inputted as the input data Din, the output of the NAND circuit 7 becomes H level and when the normal write signal WE is at H level, the output of the AND circuit 8 also becomes H level. Thereby, the column selecting switch 4 is made ON and the input data "1" is written to the memory cell 2.

As described above, according to the second embodiment of the invention, in the multiple bits product, there is enabled selection of whether the input data is written in an arbitrary data direction ("0" data according to the second embodiment) for respective bits.

<<THE THIRD EMBODIMENT>>

Figure 5:
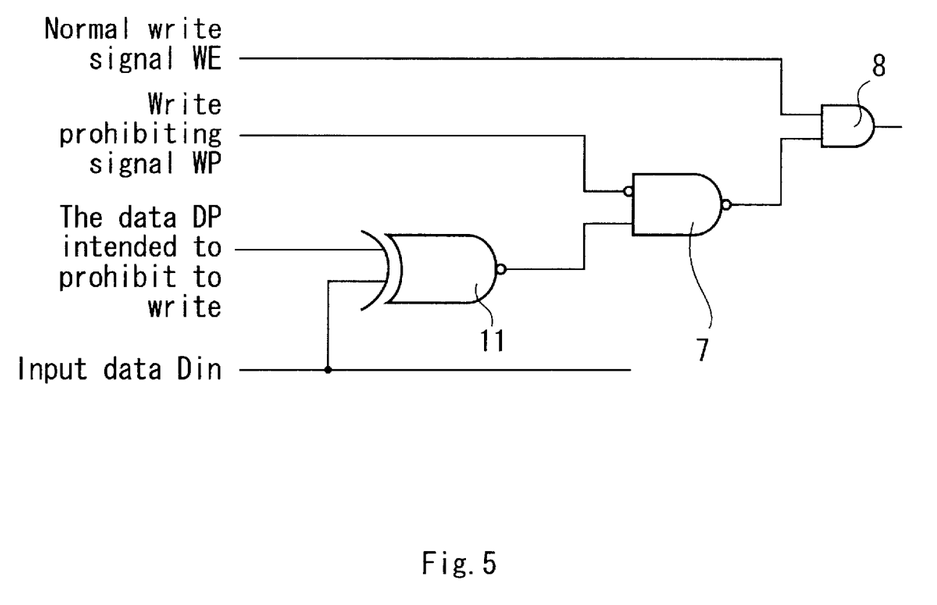
FIG. 5 is a column selecting switch control circuit diagram according to a third embodiment of the invention.

FIG. 5 shows a circuit constitution diagram of a semiconductor memory device according to a third embodiment of the invention. However, in FIG. 5, there is only illustrated the write prohibiting control circuit 13 constituting the column selecting switch control circuit 10. The other portion is provided with a constitution the same as that of FIG. 1. In this embodiment, there is shown an example of a case capable of selecting either of "0" data or "1" data is to be prohibited to write.

The write prohibiting control circuit 13 shown in FIG. 5 differs from the write prohibiting control circuit 13 shown in FIG. 1 in that in place of the input data Din inputted to the NAND circuit 7, an output of an Exclusive Nor circuit (hereinafter, referred to as "EXNOR circuit") 11 is inputted. The EXNOR circuit 11 is inputted with the input data Din and the data Dp intended to prohibit to write.

Next, an explanation will be given of operation of the column selecting switch control circuit shown in FIG. 5.

(1) Assume that "0" is inputted as the data Dp intended to prohibit to write.

Here, when "0" is inputted as the input data Din, the EXNOR circuit 11 becomes H level. Then, when the write prohibiting signal WP becomes L level, the output of the NAND circuit 7 becomes L level. Therefore, the output of the AND circuit 8 becomes L level, the column selecting switch 4 is made OFF and the input data "0" is not written to the memory cell 2.

Meanwhile, when "1" is inputted as the input data Din, the output of the EXNOR circuit 11 becomes L level. Then, the output of the NAND circuit 7 becomes H level and when the normal write signal WE is at H level, the output of the AND circuit 8 becomes H level. Thereby, the column selecting switch 4 is made ON and the input data "1" is written to the memory cell 2.

(2) Assume that "1" is inputted as the data Dp intended to prohibit to write.

Here, when "1" is inputted as the input data Din, the output of the EXNOR circuit 11 becomes H level. Then, when the write prohibiting signal WP is at L level, the output of the NAND circuit 7 becomes L level. Therefore, the output of the AND circuit 8 becomes L level, the column selecting switch 4 is made OFF and the input data "1" is not written to the memory cell 2.

Meanwhile, when "0" is inputted as the input data Din, the output of the EXNOR circuit 11 becomes L level. Then, the output of the NAND circuit 7 becomes H level and when the normal write signal WE is at H level, the output of the AND circuit 8 becomes H level. Thereby, the column selecting switch 4 is made ON and the input data "0" is written to the memory cell 2.

In this way, according to the third embodiment of the invention, by inputting the data Dp intended to prohibit to write from outside, either of "0" data or "1" i data is to be prohibited to write, can be selected.

<<THE FOURTH EMBODIMENT>>

Figure 6:
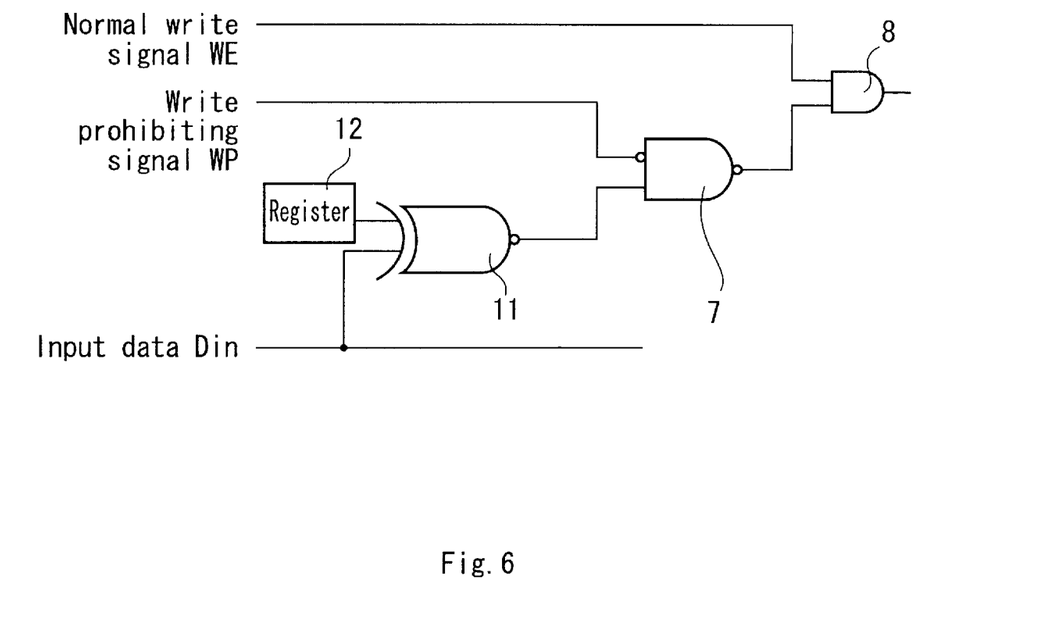
FIG. 6 is a column selecting switch control circuit diagram according to a fourth embodiment.

FIG. 6 shows a circuit constitution diagram of a semiconductor memory device according to a fourth embodiment of the invention. However, in FIG. 6, there is only illustrated the write prohibiting control circuit 13 constituting the column selecting switch control circuit 10. The other portion is provided with the constitution the same as that of FIG. 1. According to the embodiment, there is shown an example of a case in which either of "0" data or "1" data is to be prohibited to write, can be selected similar to the third embodiment.

The write prohibiting control circuit 13 of FIG. 6 differs from the write prohibiting control circuit 13 shown in FIG. 5 in that in place of the data Dp intended to prohibit to write inputted to the EXNOR circuit 11, data inputted to a register 12 is utilized. The register 12 is inputted with data intended to prohibit to write by a command input before normal operation.

The operation of the write prohibiting control circuit 13 shown in FIG. 6 is substantially similar to operation explained in the third embodiment. The difference from the operation explained in the third embodiment, resides in that in place of the data Dp intended to prohibit to write, the data inputted to the register 12 is utilized and the other operation is similar.

In this way, according to the fourth embodiment of the invention, by storing the data Dp intended to prohibit to write in the register, either of "0" data or "1" data is to be prohibited to write, can be selected. Further, whereas according to the third embodiment, there is needed pins for inputting the data Dp intended to prohibit to write from outside, according to the embodiment, an increase in a number of pins can be prevented.

What is claimed is:

1. A semiconductor memory device comprising:
   a plurality of memory cells for storing data;
   a plurality of input control circuits for receiving input control signals for input data of multiple bits; and
   a plurality of write control circuits each for prohibiting a corresponding bit of the input data from being written to corresponding memory cells on a bit by bit basis when the corresponding bit of the input data is predetermined data.

2. A semiconductor memory device according to claim 1, wherein each of the write control circuits is inputted with a write prohibiting signal, each of the write control circuits prohibits the corresponding bit of the input data from being written to the corresponding one of the memory cells when the write prohibiting signal is brought into an activated state and the corresponding bit of the input data is the predetermined data.

3. A semiconductor memory device according to claim 1, wherein each of the write control circuits is inputted with a reference signal, each of the write control circuits prohibits the corresponding bit of the input data from being written to the corresponding one of the memory cells when the reference signal and the corresponding bit of the input data coincide with each other.

4. A semiconductor memory device according to claim 1, wherein each of the write control circuits is inputted with a write prohibiting signal and a reference signal, each of the write control circuits prohibits the corresponding bit of the input data from being written to the corresponding one of the memory cells when the write prohibiting signal is brought into an active state and the reference signal and the corresponding bit of the input data coincide with each other.

5. A semiconductor memory device according to claim 3, wherein the reference signal is inputted from outside.

6. A semiconductor memory device according to claim 4, wherein the reference signal is inputted from outside.

7. A semiconductor memory device according to claim 3, wherein the reference signal is generated based on an indication that data is stored in registers.

8. A semiconductor memory device according to claim 4, wherein the reference signal is generated based on an indication that data is stored in registers.

9. A semiconductor memory device comprising:
   a plurality of memory cells for storing data;
   a plurality of bit line pairs connected to the memory cells;
   a plurality of input control circuits for receiving input signals for input data of multiple bits;

a plurality of selecting circuits for selecting the bit line pairs, the selecting circuits are provided in correspondence with the bit line pairs; and a plurality of selection control circuits for controlling selection/non-selection of the selecting circuits, each of the selection control circuits is provided in correspondence with each of the selecting circuits;

wherein each of the selection control circuits determines corresponding one of the selecting circuits as non-selection on a bit by bit basis when a corresponding bit of the input data is predetermined data.

10. A semiconductor memory device according to claim 9, wherein each of the selection control circuits is inputted with a write prohibiting signal, each of the selection control circuits determines the corresponding one of the selecting circuits as non-selection when the write prohibiting signal is brought into an activated state and the corresponding bit of the input data is the predetermined data.

11. A semiconductor memory device according to claim 9, wherein each of the selection control circuits is inputted with a reference signal, each of the selection control circuits determines the corresponding one of the selecting circuits as non-selection when the reference signal and the corresponding bit of the input data coincide with each other.

12. A semiconductor memory device according to claim 9, wherein each of the selection control circuits is inputted with a write prohibiting signal and a reference signal, each of the selection control circuits determines the corresponding one of the selecting circuits as non-selection when the write prohibiting signal is brought into an activated state and the reference signal and the corresponding bit of the input data coincide with each other.

13. A semiconductor memory device according to claim 11, wherein the reference signal is inputted from outside.

14. A semiconductor memory device according to claim 12, wherein the reference signal is inputted from outside.

15. A semiconductor memory device according to claim 11, wherein the reference signal is generated based on an indication that data is stored in registers.

16. A semiconductor memory device according to claim 12, wherein the reference signal is generated based on an indication that data is stored in registers.

* * * * *